United States Patent
Dai et al.

(10) Patent No.: US 8,232,567 B2
(45) Date of Patent: Jul. 31, 2012

(54) LIGHT EMITTING DEVICE WITH PILLAR STRUCTURE HAVING HOLLOW STRUCTURE

(75) Inventors: Jing-Jie Dai, Taichung (TW); Wen-Chung Shih, Taichung (TW); Bo-Yuan Huang, Taichung (TW); Su-Hui Lin, Taichung (TW); Yu-Chieh Huang, Taichung (TW)

(73) Assignee: HUGA Optotech Inc., Taichung (TW)

( * ) Notice: Subject to any disclaimer, the term of this patent is extended or adjusted under 35 U.S.C. 154(b) by 157 days.

(21) Appl. No.: 12/425,730

(22) Filed: Apr. 17, 2009

(65) Prior Publication Data
US 2010/0244053 A1    Sep. 30, 2010

(30) Foreign Application Priority Data
Mar. 30, 2009    (TW) .............................. 98110356 A

(51) Int. Cl.
*H01L 33/00* (2010.01)
(52) U.S. Cl. ................ 257/94; 257/97; 257/98; 257/99; 257/100
(58) Field of Classification Search ............... 257/91, 257/81, 79, 84, 88, 93, 94, 99, 690, 698, 257/700
See application file for complete search history.

(56) References Cited

U.S. PATENT DOCUMENTS

| | | | | |
|---|---|---|---|---|
| 4,758,532 A | * | 7/1988 | Yagi et al. | 438/24 |
| 5,047,364 A | * | 9/1991 | Hattori | 438/28 |
| 5,780,320 A | * | 7/1998 | Kinoshita | 438/33 |
| 6,518,598 B1 | * | 2/2003 | Chen | 257/91 |
| 6,531,405 B1 | * | 3/2003 | Wegleiter et al. | 438/745 |
| 6,727,646 B1 | * | 4/2004 | Koyama et al. | 313/506 |
| 7,009,216 B2 | * | 3/2006 | Otsuka et al. | 257/98 |
| 7,208,336 B2 | * | 4/2007 | Wu et al. | 438/35 |
| 7,824,007 B2 | * | 11/2010 | Chikamoto et al. | 347/33 |
| 2006/0234408 A1 | * | 10/2006 | Lee et al. | 438/22 |
| 2008/0128716 A1 | * | 6/2008 | Tazima et al. | 257/88 |
| 2008/0230791 A1 | * | 9/2008 | Lin et al. | 257/91 |
| 2010/0059733 A1 | * | 3/2010 | Shei et al. | 257/13 |
| 2010/0059769 A1 | * | 3/2010 | Jeong | 257/94 |

* cited by examiner

*Primary Examiner* — Marcos D. Pizarro
*Assistant Examiner* — Bilkis Jahan
(74) *Attorney, Agent, or Firm* — Jianq Chyun IP Office

(57) ABSTRACT

A light emitting device, includes a substrate; a first semiconductor layer on the substrate; an active layer on the first semiconductor layer; a second semiconductor layer on the active layer; a transparent conductive layer on the second semiconductor layer; and a plurality of pillar structures with a hollow structure in the portion surface of the first semiconductor layer, thereby, the light extraction efficiency of the light emitting device can be improved due to the pillar structures with a hollow structure.

9 Claims, 12 Drawing Sheets

LIGHT EMITTING DEVICE WITH PILLAR STRUCTURE HAVING HOLLOW STRUCTURE

BACKGROUND OF THE INVENTION

1. Field of the Invention

The present invention is a light emitting device, and more particularly is to form a plurality of pillar structure with hollow structure therein to increase the light extraction efficiency of the light emitting device.

2. Description of the Prior Art

The major reason for the lower output of illumination efficiency of the optical device, such as light emitting device, is that the light extraction efficiency of the light extraction is insufficient. That is to say, the actual illumination is emitted from the light emitting device that is part of the illumination of the active layer. Thus, a photon element is utilized in the light emitting device to improve the light extraction efficiency of the light emitting device in the conventional technology.

In the past, as shown in FIG. 1A, the semiconductor light emitting device with blue light includes a sapphire substrate 100; a GaN buffer layer 102 is disposed on the sapphire substrate 100; a n-type GaN semiconductor layer 104 is formed on the GaN buffer layer 102. Because the band gap of the active layer 106 is smaller than the band gap of the n-type GaN semiconductor layer 104, thus, the material of the active layer 106 can be InGaN compound semiconductor layer. The n-type semiconductor layer 104, the active layer 106, and p-type semiconductor layer 108 can be stacked to server as a semiconductor stacked layer. Next, a transparent conductive layer 110 is formed on the P-type semiconductor layer 108, and a p-side electrode 114 is disposed on the surface of the transparent conductive layer 110, and the n-side electrode 116 is disposed on the exposed surface of the n-type GaN semiconductor layer 104. In order to increase the closed efficiency for the carrier, the AlGaN with large band-gap can be used for the material of n-type GaN semiconductor layer 104 and P-type semiconductor layer 108 on the active layer 106.

In order to form the n-side electrode 116, the portion of semiconductor layer 108 is removed to expose the portion surface of the n-type semiconductor layer 104, and the width W is also formed by removing a portion of peripheral of light emitting device. Due to the hardness of the material of GaN semiconductor layer on the peripheral of the light emitting device is difficult to saw or carve, the formation of the active layer 106 is formed by dry etching process to avoid the crack is generated within the active layer 106. Further, the reflective index (reflective index is 2.5) of the GaN semiconductor layer is equally to the other compound semiconductor layer, and the reflective index is larger than the air (the reflective index is 1.0), and thus, the light is emitted from the active layer 106 through the semiconductor layer 108 to the air (now shown) that would be induced the total reflection, so as to the light would not emitted from the semiconductor layer 108 to the outside. Thus, the light is reflected repeatedly to increase within the semiconductor layer to decay of the illumination, so that the light extraction efficiency is decreased to 10%.

In order to solve the light extraction efficiency of the light emitting device, as shown in FIG. 1B, in the GaP, AlGaInP, AlGaAs compound semiconductor layer, the concave and raised structure is formed around the peripheral of the light emitting device, so that the light can be extracted from the semiconductor stacked layer to the outside. As shown in FIG. 1B, the n-type GaP layer 202 and p-GaP layer 204 is formed as the semiconductor stacked layer, and p-side electrode 206 is disposed on the surface of the semiconductor stacked layer, and n-side electrode 210. After die sawing process, a plurality of LED die can be obtained, and an etching process such as hydrochloric acid (HCl) solution to form the rough surface among the concave and raised structure of the surface of the LED die.

In order to increase the light emitting efficiency, the current is applied to the electrode to increase the current density, but the reliability and usage life of the light emitting device would be decreased.

According to discussion above, the improved light emitting device needs to overcome the drawbacks of the conventional technology. Thus, the issue of the total reflection is drawn out from the substrate and the light decay is prevented which needs to solve in this invention.

SUMMARY OF THE INVENTION

According to the problems described above, the main object of the present invention is to provide a plurality of pillar structures with a hollow structure in the light emitting device to increase the light extraction efficiency for the light emitting device.

Another object of the present invention is to increase the scattering efficiency of the light emitting device by the rough surface on the outer surface and the inner surface of the pillar structure, so as to increase the light extraction efficiency for the light emitting device.

Another object of the present invention is to increase the scattering efficiency of the light emitting device by the hollow structure with different depths to increase the light extraction efficiency for the light emitting device.

According to above objects, the present invention provides a light emitting device, which includes: a substrate; a first semiconductor layer disposed on the substrate; an active layer disposed on the first semiconductor layer; a second semiconductor layer disposed on the active layer; a transparent conductive layer disposed on the second semiconductor layer; an a plurality of pillar structures with a hollow structure disposed in the portion surface of the first semiconductor layer The present invention also provides another light emitting device which includes: a substrate; a first semiconductor layer disposed on the substrate and exposed the portion of the substrate; an active layer disposed on the first semiconductor layer; a second semiconductor layer disposed on the active layer; a transparent conductive layer disposed on the second semiconductor layer; and a plurality of pillar structures with a hollow structure disposed in the portion surface of the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figure 1A:
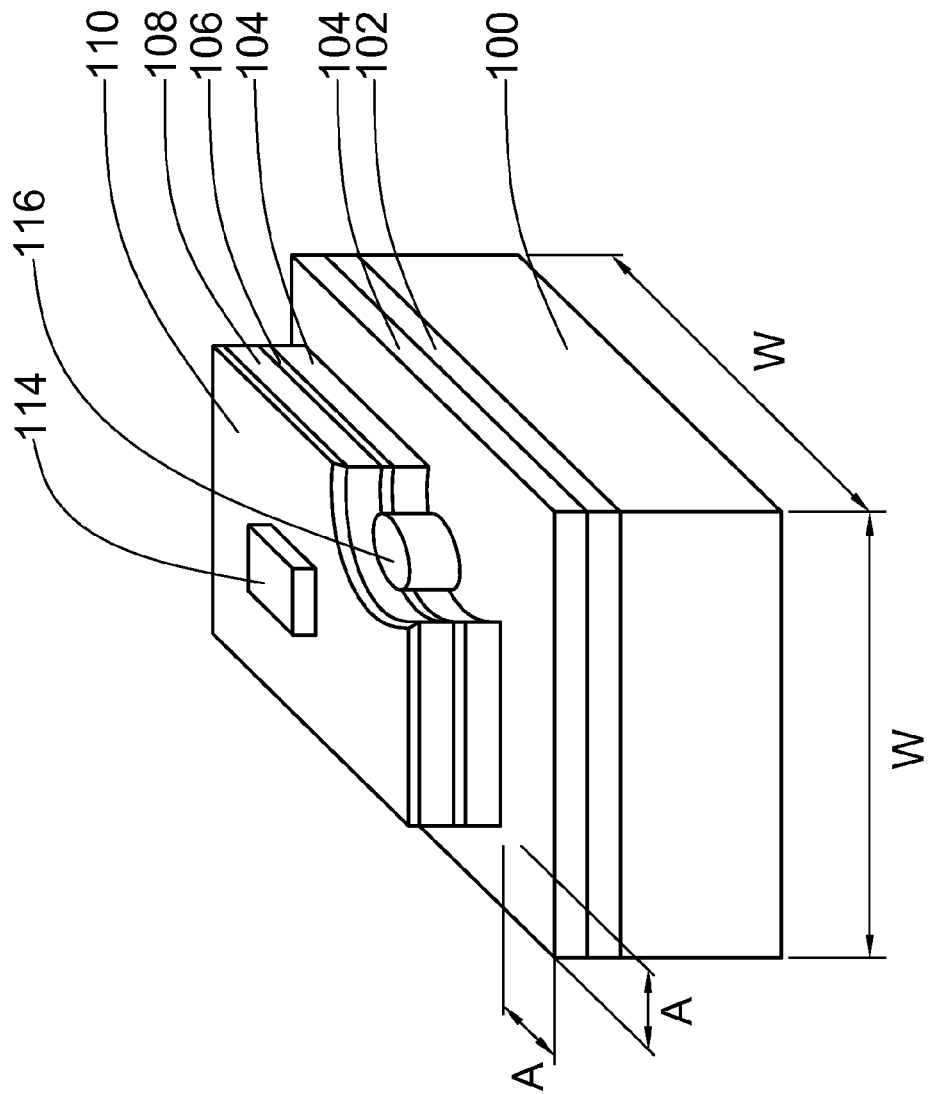
FIG. 1A is a cross-sectional view of showing a light emitting device with GaN in accordance with the conventional prior art.
Figure 1B:
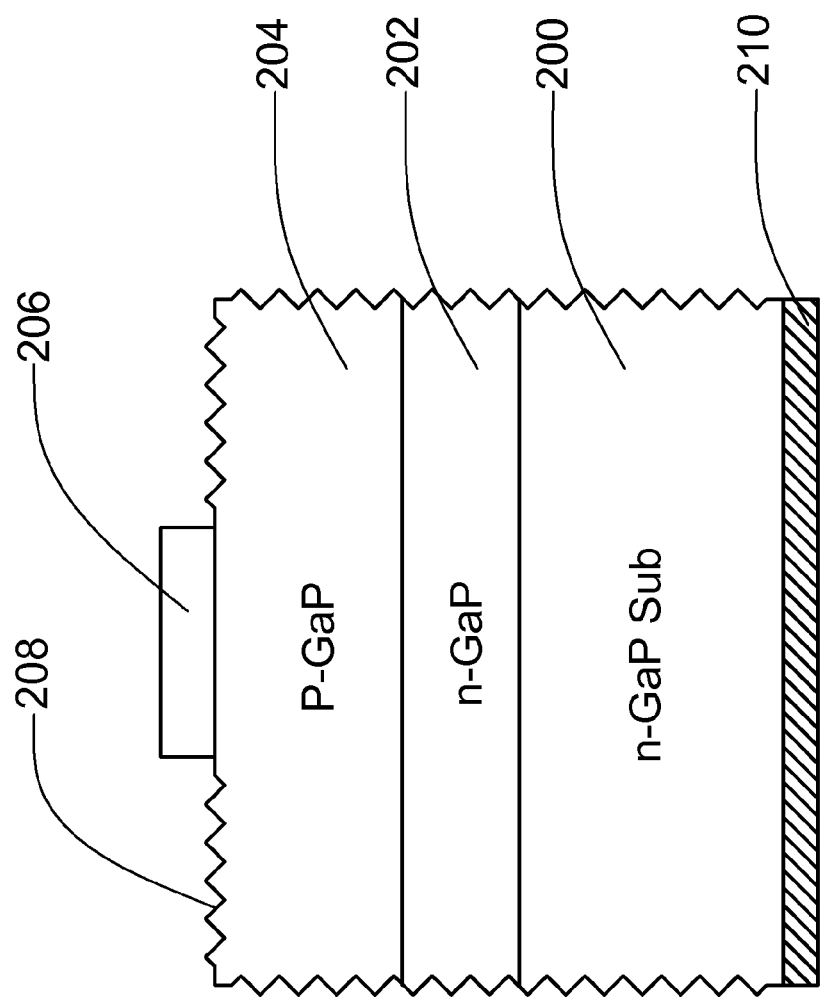
FIG. 1B is a cross-sectional view of showing a light emitting device with GaP, and a concave and raised structures disposed on the surface of the light emitting device thereon in accordance with the conventional prior art.
Figure 2A:
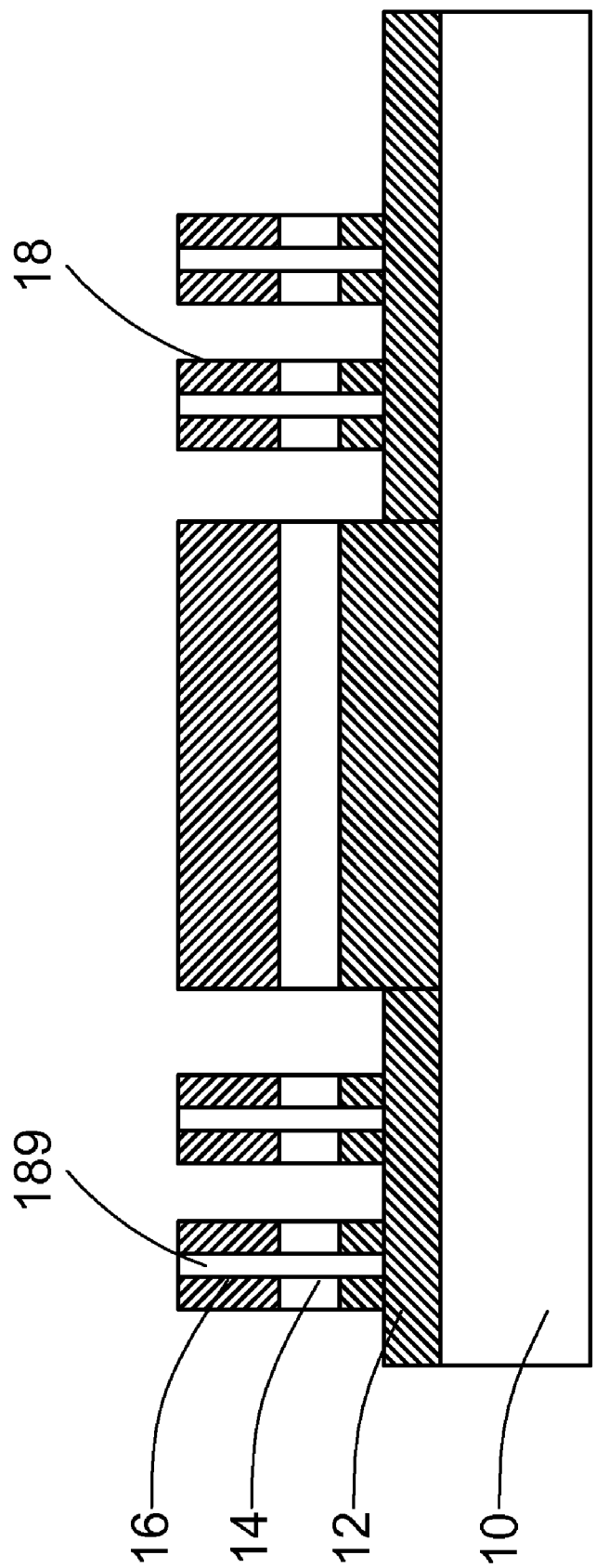
FIG. 2A is a view of showing a light emitting device in accordance with the present invention.

FIG. 2A is a view showing an embodiment of a light emitting device of the present invention. Firstly, a substrate 10 of sapphire in MOVPE is provided. A buffer layer (not shown), such as a multi-strain releasing layer, is formed on the substrate 10. In the embodiment, the buffer layer has a compound layer (not shown) and a V-II group compound layer (not shown). The compound layer is on the substrate 10 and gallium nitride based, such as AlGaN. For the substrate 10, it is selected from the group consisting of: sapphire, $MgAl_2O_4$, GaN, AlN, SiC, GaAs, AlN, GaP, Si, Ge, ZnO, MgO, LAO, LGO and glass material.

Next, a semiconductor epi-stacked structure is formed on the buffer layer (not shown), which includes a first semiconductor layer 12 on the buffer layer, an active layer 14 on the first semiconductor layer 12, and a second semiconductor layer 16 on the active layer 14. The first semiconductor layer 12 and the second semiconductor layer 16 are made of III-V group compound of nitride-based material. Furthermore, the first semiconductor layer 12 and the second semiconductor layer 16 have different electric conductive for example, the first semiconductor layer 12 of N-type associated with the second semiconductor layer 16 of P-type. In addition, when the first semiconductor layer 12 is an N-type semiconductor conductive layer, the second semiconductor layer 16 must be P-type semiconductor layer. It is very clear to know that the active layer 14 is formed between the N-type semiconductor layer 12 and the P-type semiconductor layer 16. The electrons and holes between the N-type semiconductor layer 12 and the P-type semiconductor layer 16 will be driven to the active layer 14 by adding some voltage and the recombination is generated to emit the light.

Thus, according to discussion above, the semiconductor epi-stacked structure of the light emitting device is not limited to the first gallium nitride (GaN) based semiconductor layer 14 of N-type or the second gallium nitride based semiconductor layer 16 of P-type, and any suitable types may be used. In the case of the second gallium nitride based semiconductor layer 16 of P-type, the first gallium nitride based semiconductor layer 14 is P-type, reversely too. Moreover, the semiconductor epi-stacked structure of the light emitting device may be used as one basic semiconductor epi-stacked structure of LED, laser, photo-detector, or VCSEL.

Then, the semiconductor process such as lithography process and etching process are performed after the semiconductor epi-stacked structure is formed. A patterned photoresist layer (not shown) is formed on the second semiconductor layer 16, and a portion region of the second semiconductor layer 16 is remained to fabricate the transparent electrode (now shown) beforehand. Thus, the pillar structure would not form on this region when the semiconductor process is finished. Meanwhile, in other regions such as sawing streets (not shown), the pattern of the pillar structures 18 with a hollow structure is defined thereon. Next, an etching process is performed to remove the portion of the second semiconductor layer 16, the active layer 14, and the first semiconductor layer 12 to form a plurality of pillar structures 18 having a hollow structure with a depth 189. In this embodiment, a suitable current is applied to the electrodes on the first semiconductor layer (n-GaN) 12 and the second semiconductor layer (p-GaN) 16 can drive the active layer 14 to emit the light respectively, and the light extraction efficiency of the light emitting device can be improved due to the light scattering effective within the plurality of pillar structures 18 with a hollow structure.

Figure 2B:
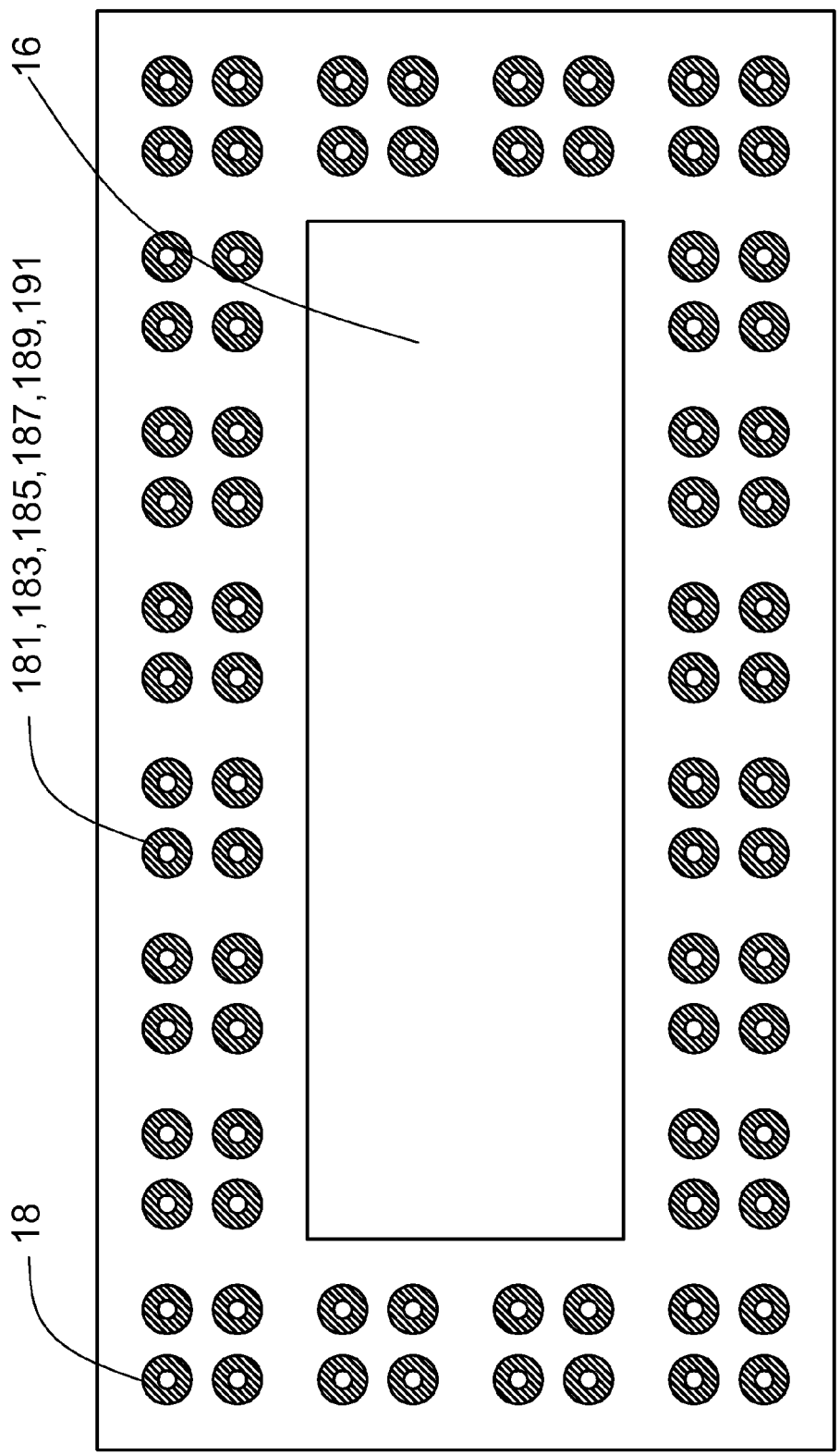
FIG. 2B is a vertical view of showing a plurality of pillar structures with a hollow structure in accordance with the present invention.

FIG. 2B is a vertical view of showing a plurality of pillar structures with a hollow structure therein. In FIG. 2B, each the plurality of pillar structures 18 has a hollow structure therein, and the region adjacent to the two sides of the pillar structures is used for forming the transparent electrode (not shown) thereon.

Figure 3A:
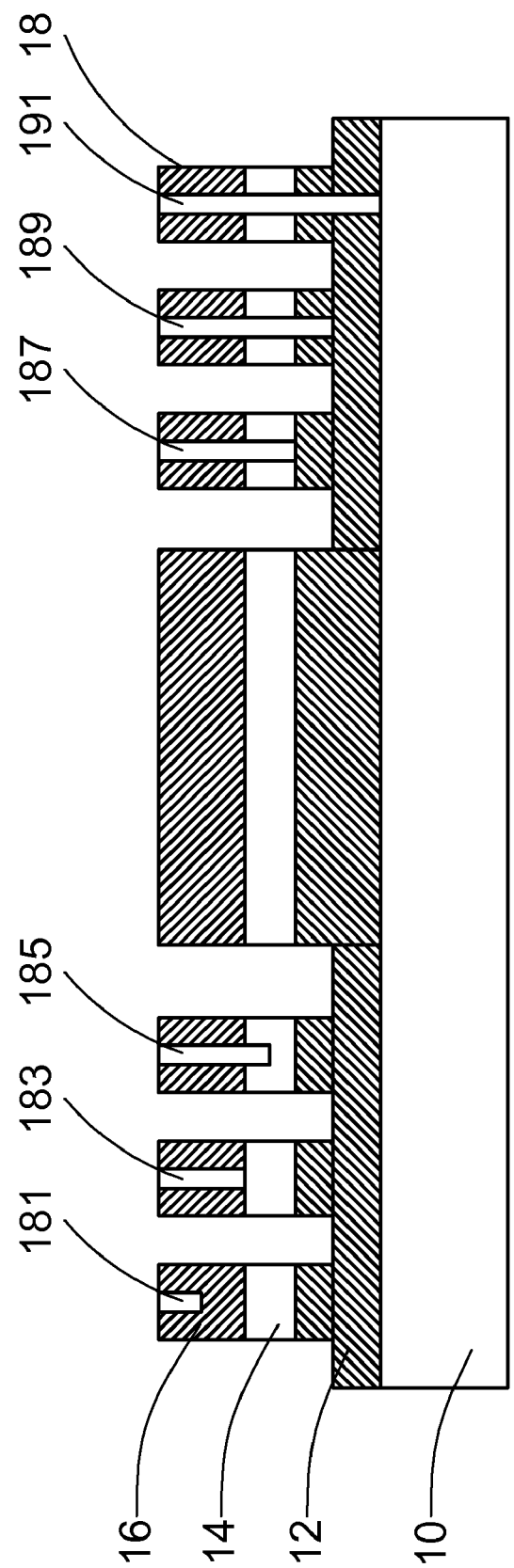
FIG. 3A to FIG. 3C is a view of showing a plurality of pillar structures with different heights that having different depths in accordance with the present invention.

In addition, FIG. 3A shows a plurality of pillar structures having a hollow structure with different depths. In FIG. 3A, the depth 181 of the hollow structure of the pillar structure 18 may be down from the second semiconductor layer 16 to an arbitrary depth of the second semiconductor layer 16; or the depth 183 of the hollow structure of the pillar structure 18 may be down from the second semiconductor layer 16 to the exposed surface of the active layer 14. In another embodiment, the depth 185 of the hollow structure of the pillar structure 18 may be down from the second semiconductor layer 16 to an arbitrary depths of the active layer 14; or the depth 187 of the hollow structure of the pillar structure 18 is down from the second semiconductor layer 16 through the active layer 14 to the exposed surface of the first semiconductor layer 12.

Furthermore, in another embodiment, the depth 189 of hollow structure of the pillar structures 18 can be down from the second semiconductor layer 16 through the active layer 14 to an arbitrary depth of the first semiconductor layer 12; or the depth 191 of the hollow structure of pillar structure 18 can be down from the second semiconductor layer 16 through the active layer 14 and is extended to the first semiconductor layer 12 to the exposed surface of the substrate 10. Therefore, when the light is emitted from the active layer 14, the scattering efficiency within the pillar structures 18 of the semiconductor epi-stacked structure can be improved due to the depths (181, 183, 185, 187, 189, and 191) of the hollow structure.

Figure 3B:
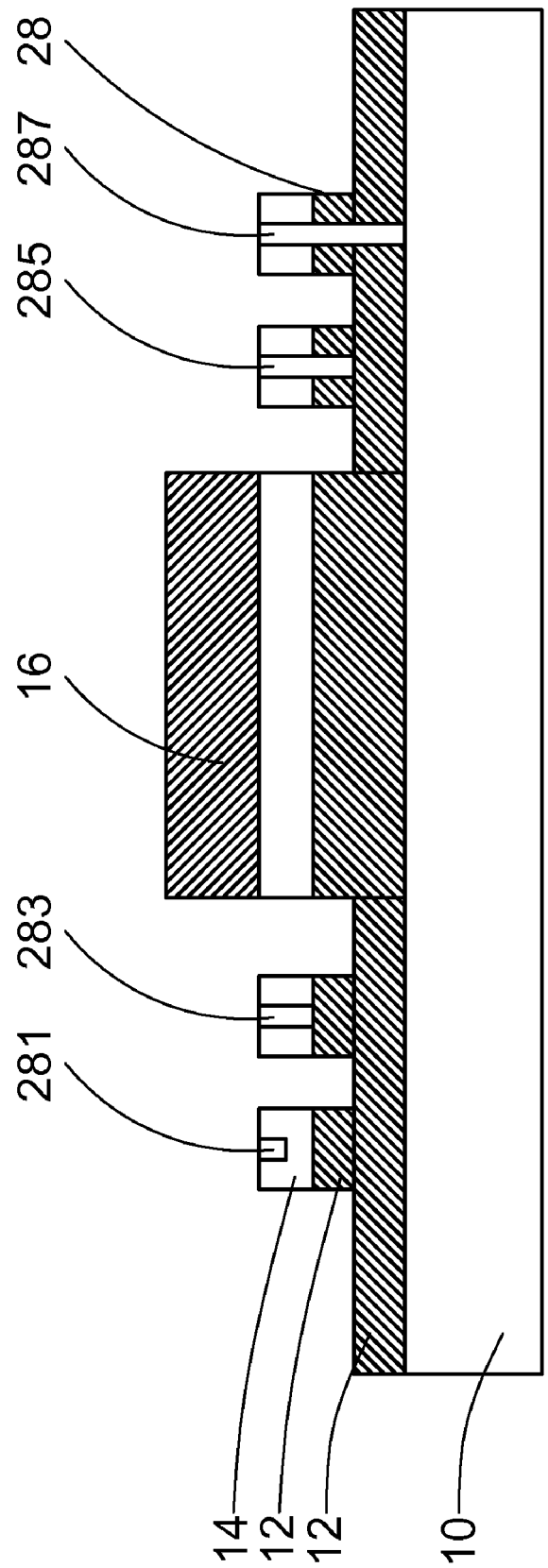
Figure 3C:
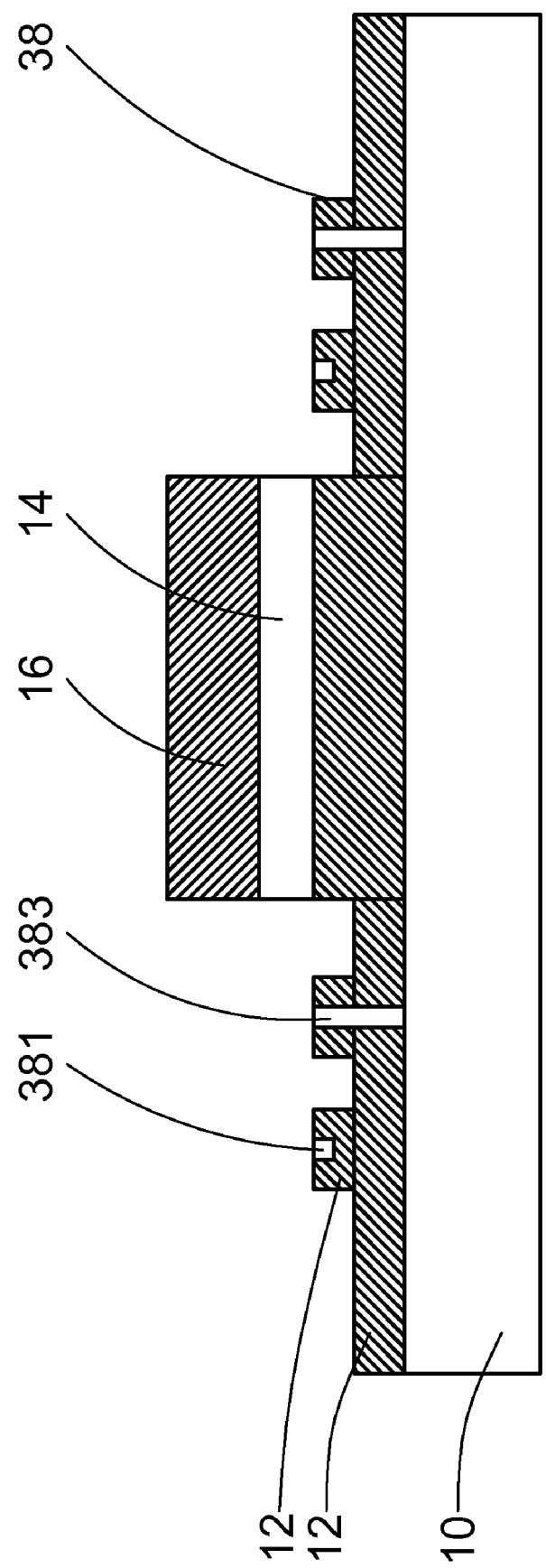

Moreover, FIG. 3B and FIG. 3C shows cross-sectional views of the pillar structure with different depths. In FIG. 3B, the height of plurality of pillar structures 28 from top to bottom includes the active layer 14 and a portion of the first semiconductor layer 12, in which the depths 281 of the hollow structure of each plurality of pillar structures 28 can be down from the active layer 14 to an arbitrary depth of the active layer 14; or the depth 283 of the hollow structure of pillar structure 28 can be down from the active layer 14 to the exposed surface of the first semiconductor layer 12; or the depth 285 of the hollow structure of pillar structure 28 can be down from the active layer 14 to an arbitrary depth of the first semiconductor layer 12; or the depth 287 of the hollow structure of the pillar structure 28 can be down from the active layer 14 though the first semiconductor layer 12 to the exposed surface of the substrate 10.

In addition, in FIG. 3C, the height of plurality of pillar structures 28 from top to bottom includes the first semiconductor layer 12, in which the depth 381 of the hollow structure of the pillar structure 38 can be down from the first semiconductor layer 12 to an arbitrary depth of the first semiconductor layer 12; or the depth 383 of the hollow structure of the pillar structure 38 can be down from the first semiconductor layer 12 to the exposed surface of the substrate 10.

Figure 4:
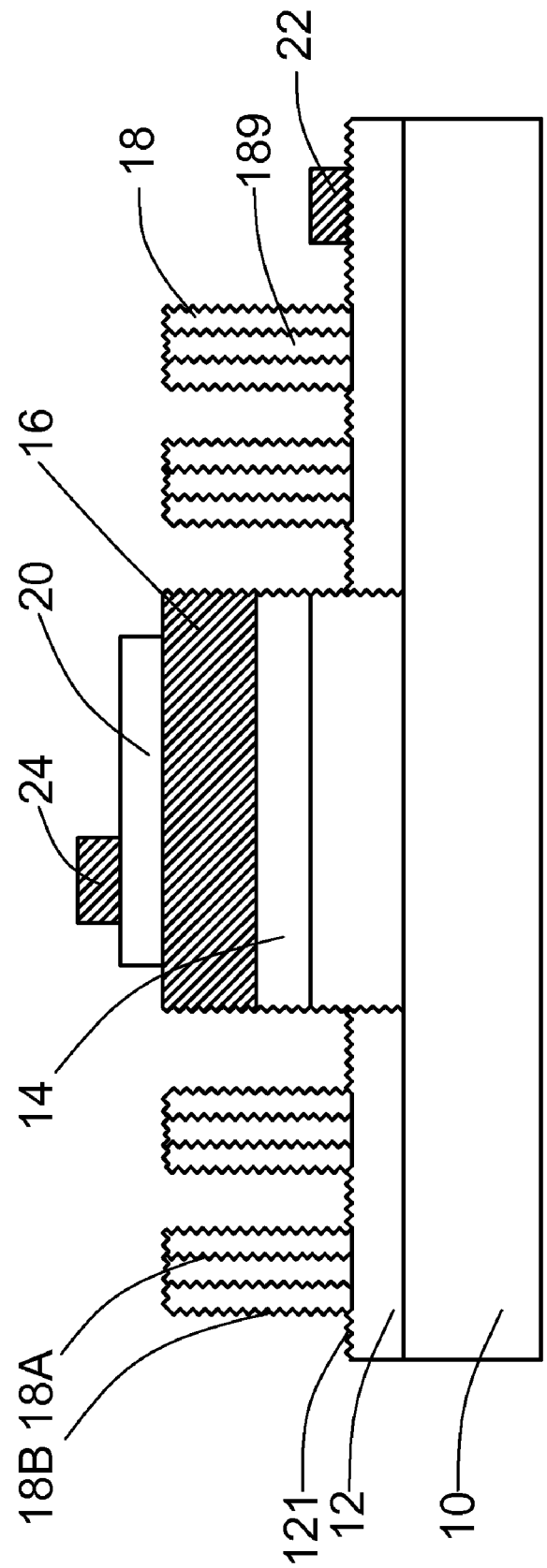
FIG. 4 is a view of showing a rough surface on the outer surface and inner surface of the plurality of pillar structures with a hollow structures for a light emitting device in accordance with the present invention.

Next, FIG. 4 shows a rough surface formed on the outer surface and inner surface of the hollow structure of the plurality of pillar structures, and the structure of the FIG. 3A is used to illustrate with following description. When the plurality of pillar structures 18 with a hollow structure 189 is formed on the first semiconductor layer 12, a photon assisted etching process is preformed to the inner surface 18A and the outer surface 18B of the pillar structures 18 to form a rough surface 121 thereon; meanwhile, the rough surface 121 is also formed on the portion surface of the first semiconductor layer 12, a sidewall of the active layer 14 and the sidewall of the second semiconductor layer 16. Therefore, the purpose of the rough surface 121 is used for increasing the light extraction efficiency when the light is emitted from the active layer 14 of the semiconductor epi-stacked structure.

Next, a transparent conductive layer 20 is formed on the second semiconductor layer 16, and the thickness of the transparent conductive layer 20 is about 2500 angstrom, and the material of the transparent conductive layer 24 can be Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide. Then, a first electrode 22 is formed on the exposed surface of the first semiconductor layer 12, and the material of the first electrode 22 can be Au/Ge/Ni, Ti/Al, TI/Al/Ti/Au or Cr/Au alloy or combination thereof. Then, a second electrode 24 with thickness of about 2000 um is formed on the transparent conductive layer 20.

In another embodiment, a transparent conductive layer 20 is formed on the second semiconductor layer 16 and a portion surface of the second semiconductor layer 16 being exposed. Next, a second electrode 24 is disposed on the second semiconductor layer 16 and contacted with the transparent conductive layer 20 (not shown). In this embodiment, due to the material of the second semiconductor layer 16 is a P-type GaN semiconductor layer, the material of the second electrode 24 can be Au/Ge/Ni, Ti/Al, TI/Al/Ti/Au, Cr/Au alloy or W/Al alloy. It is noted that the manufacture processes of the first electrode 22 and the second electrode 24 is well know in the description above, therefore, the detail description of the manufacture process is omitted herein.

Furthermore, the present invention also provides another embodiment of a light emitting device having a plurality of pillar structures with a hollow structure. Because the embodiment of the formation of the first semiconductor layer 32, the active layer 24 and the second semiconductor layer on the substrate 10 is well know in the description above, therefore, the detail description of the manufacture process is omitted herein.

Figure 5A:
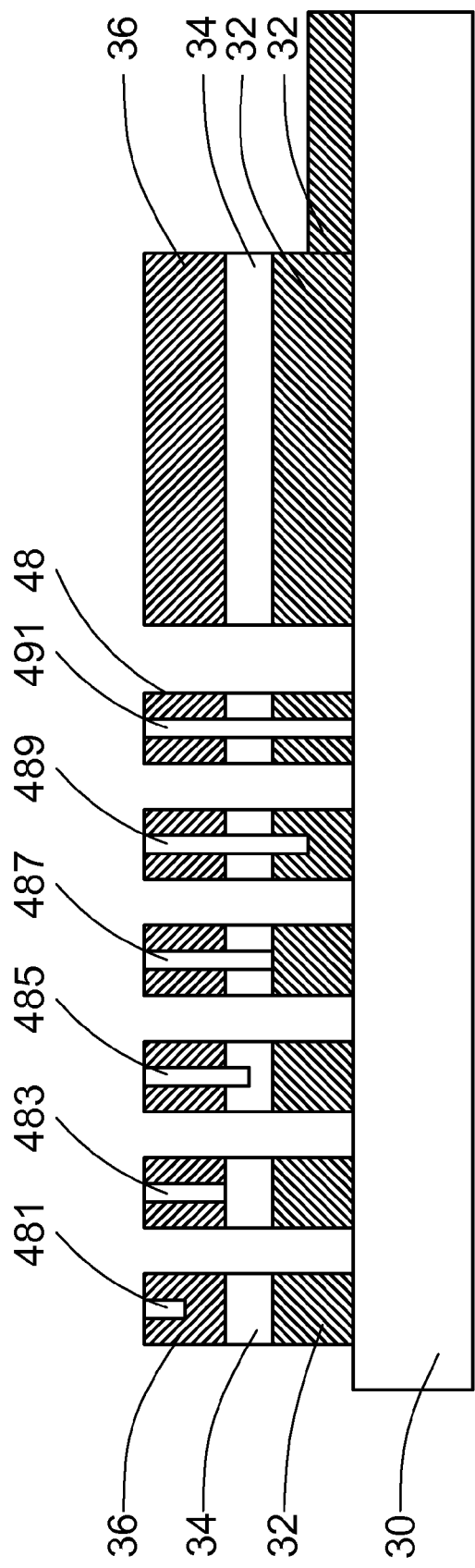
FIG. 5A to FIG. 5C are views of showing a plurality of pillar structures with different heights that having different depths on the substrate in accordance with the present invention.

Referring to FIG. 5A, shows a plurality of pillar structures having a hollow structure on the substrate. Firstly, the semiconductor process, such as lithography process and etching process is utilized to form a patterned photoresist layer (not shown) on the second semiconductor layer 36 of the semiconductor epi-stacked structure. Next, one side of the beforehand region is used for forming the transparent electrode (not shown) thereon, a dry etching process is utilized to remove the portion of the second semiconductor layer 36, the portion of the active layer 34, and the portion of first semiconductor layer 32 to expose the portion surface of the first semiconductor layer 32 and the surface of the substrate 30 on the thereon, and the plurality of pillar structures 48 with a hollow structure is formed on the substrate 30.

In this embodiment, the height of plurality of pillar structures 48 from top to bottom includes the second semiconductor layer 36, the active layer 34, and the first semiconductor layer 32. Similarly, a suitable current is applied to the electrodes on the first semiconductor layer (n-GaN) 32 and the second semiconductor layer (p-GaN) 36 can drive the active layer 34 to emit the light respectively, and the light extraction efficiency of the light emitting device can be improved due to the light scattering effective within the plurality of pillar structures 48 with a hollow structure.

Next, referring to FIG. 5A again, the depth 481 of the hollow structure of pillar structure 48 can be down from the second semiconductor layer 36 to an arbitrary depth of the second semiconductor layer 36; or the depth 483 of the hollow structure of the pillar structure 48 can be down from the second semiconductor layer 36 to the exposed surface of the active layer 34. In another embodiment, the depth 485 of the hollow structure of the pillar structure 48 can be down from the second semiconductor layer 36 to an arbitrary depth of the active layer 34; or the depth 487 of the hollow structure of the pillar structure 48 can be down from the second semiconductor layer 36 through the active layer 34 to the exposed surface of the first semiconductor layer 32; or the depth 489 of the hollow structure of the pillar structure 48 can be down from the second semiconductor layer 36 through the active layer 34 to an arbitrary depth of the first semiconductor layer 32; or the depth 491 of the hollow structure of the pillar structure 48 can be down from the second semiconductor layer 36 through the active layer 34 and is extended to the first semiconductor layer 32 to the exposed surface of the substrate 30. It is noted that when the light is emitted from the active layer 34, the scattering efficiency within the pillar structure 48 of the semiconductor epi-stacked structure (not shown) can be improved due to the depths (481, 483, 485, 487, 489, and 491) of the hollow structure.

Figure 5B:
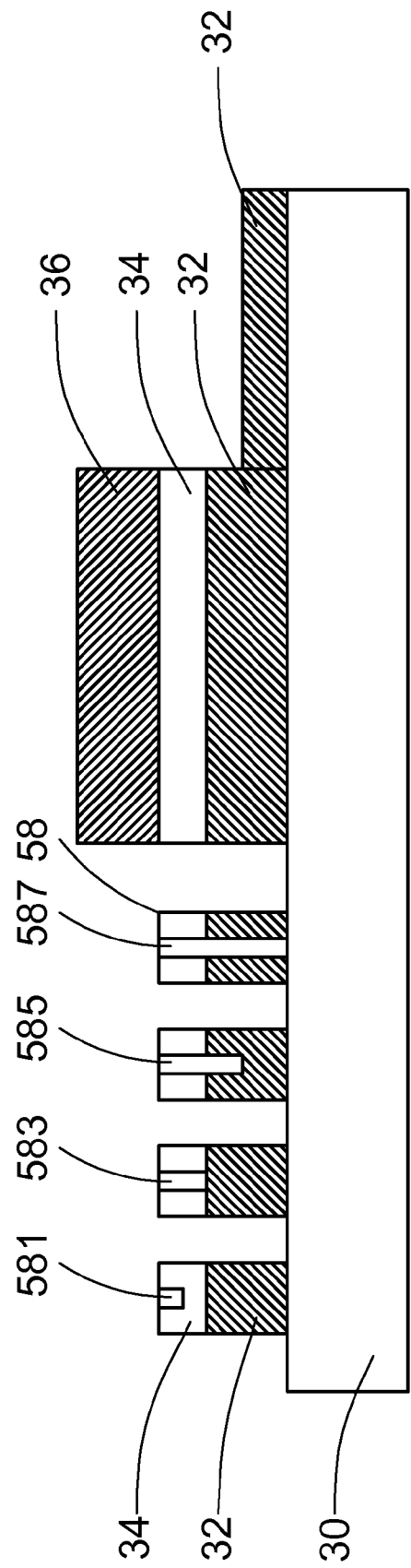

Moreover, FIG. 5B shows a plurality of pillar structure having a hollow structure with different depth. In this embodiment, the height of the pillar structure 58 includes the active layer 34 and the first semiconductor layer 32. The depth 581 of hollow structure of each plurality of pillar structures 58 can be down from the active layer 34 to an arbitrary depth of the active layer 34; or the depth 583 of the hollow structure of pillar structures 58 can be down from the active layer 34 to the exposed surface of the first semiconductor layer 32; or the depth 585 of the hollow structure of pillar structure 58 can be down from the active layer 34 to an arbitrary depth of the first semiconductor layer 32; or the depth 587 of the hollow structure of the pillar structure 58 can be down from the active layer 34 through the first semiconductor layer 32 to the exposed surface of the substrate 30.

Figure 5C:
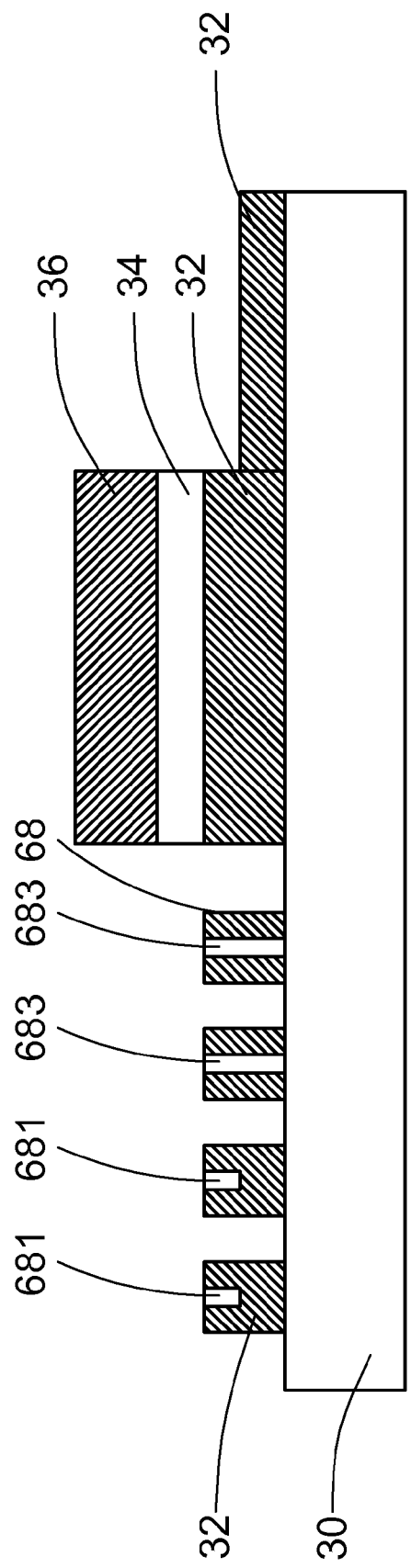

Please refer to FIG. 5C, the height of pillar structure 68 is same as the height of the first semiconductor layer 32. Thus, the depth 681 of the hollow structure of the pillar structure 68 can be down from the first semiconductor layer 32 to an arbitrary depth 683 of the first semiconductor layer 32; or the depth 683 of the hollow structure of the pillar structure 68 can be down from the first semiconductor layer 32 to the exposed surface of the substrate 30.

Figure 6:
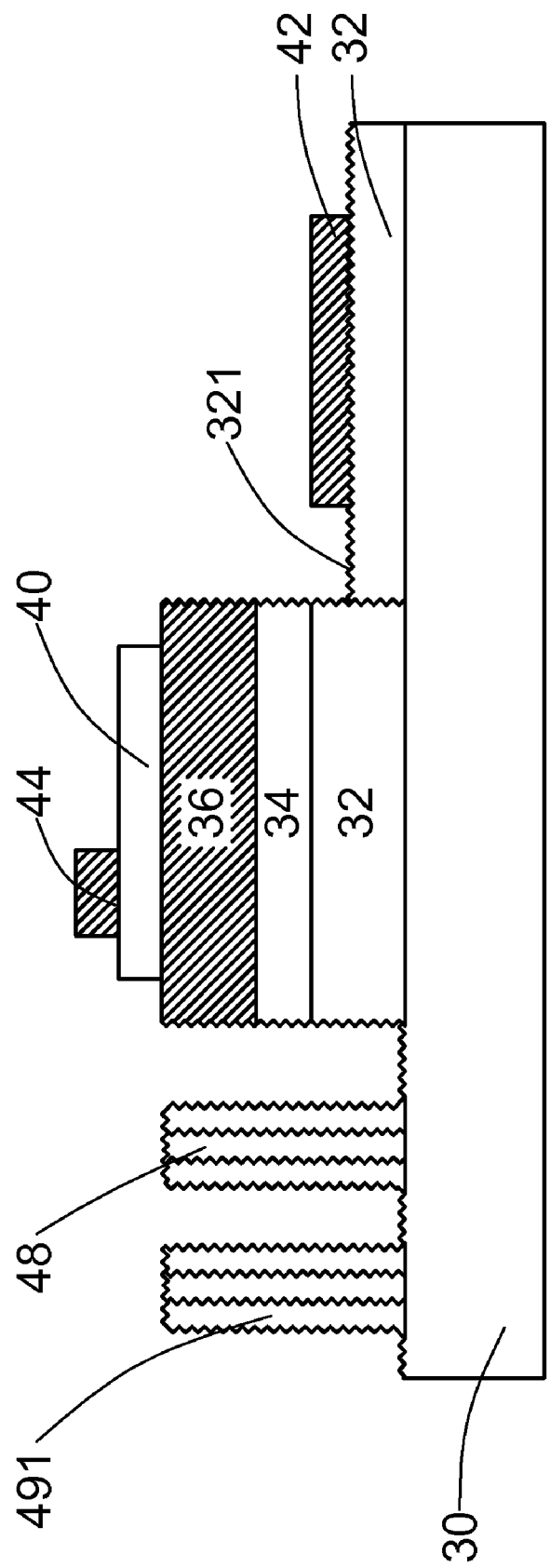
FIG. 6 is a view of showing a light emitting device having a plurality of pillar structures with a hollow structure in accordance with the present invention.

Referring to FIG. 6, is a view of showing a rough surface formed on the surface of the pillar structures, and the structure of the FIG. 5A is used to illustrate with following description. After the plurality of pillar structures 48 having a hollow structure 491 is formed, a photon assisted etching process is performed to form a rough surface 321 on the outer surface and the inner surface of the pillar structures 48, and the rough surface 321 is also formed on the portion surface of the substrate 30, a sidewall of the first semiconductor layer 32, a sidewall of the active layer 34, and sidewall of the second semiconductor layer 36. In this embodiment, the purpose of the rough surface 321 is used for increasing the light extraction efficiency of the light emitting device.

Next, a transparent conductive layer 40 is formed on the second semiconductor layer 36, and the thickness of the transparent conductive layer 40 is about 2500 angstrom, and the material of the transparent conductive layer 40 can be Ni/Au, NiO/Au, Ta/Au, TiWN, TN, Indium Tin Oxide, Chromium Tin Oxide, Antinomy doped Tin Oxide, Zinc Aluminum Oxide and Zinc Tin Oxide. Then, a first electrode 42 is formed on the exposed surface of the first semiconductor layer 32, and the material of the first electrode 42 can be Au/Ge/Ni, Ti/Al, Tl/Al/Ti/Au or Cr/Au alloy or combination thereof. Then, a second electrode 44 with thickness of about 2000 um is formed on the transparent conductive layer 40.

In another embodiment, a transparent conductive layer 40 is formed on the second semiconductor layer 36 and a portion surface of the second semiconductor layer 36 being exposed. Next, a second electrode 44 is disposed on the second semiconductor layer 36 and contacted with the transparent conductive layer 40 (not shown). In this embodiment, due to the material of the second semiconductor layer 36 is a P-type GaN semiconductor layer, the material of the second electrode 44 can be Au/Ge/Ni, Ti/Al, Tl/Al/Ti/Au, Cr/Au alloy or W/Al alloy. It is noted that the manufacture processes of the first electrode 42 and the second electrode 44 is well know in the description above, therefore, the detail description of the manufacture process is omitted herein.

The invention claimed is:

1. A light emitting device, comprising: a substrate; a first semiconductor layer disposed on a surface of said substrate; an active layer disposed on a first portion surface of said first semiconductor layer; a second semiconductor layer disposed on said active layer; a transparent conductive layer disposed on said second semiconductor layer; and a plurality of pillar structures disposed on a second portion surface of said first semiconductor layer, said plurality of pillar structures having a hollow structure therein, and said plurality of pillar structures being separated from each other, wherein each said plurality of pillar structures from top to bottom comprises said second semiconductor layer, said active layer, and said first semiconductor layer, wherein the depth of said hollow structure of each said plurality of pillar structures respectively extends down from said second semiconductor layer until an arbitrary depth of said second semiconductor layer, from said second semiconductor layer until an exposed surface of said active layer, from said second semiconductor layer until an arbitrary depth of said active layer, from said second semiconductor layer through said active layer until an exposed surface of said first semiconductor layer, from said second semiconductor layer through said active layer until an arbitrary depth of said first semiconductor layer, and from said second semiconductor layer through said active layer and extended down until a bottom portion of said first semiconductor layer.

2. The light emitting device according to claim 1, wherein each said plurality of pillar structures from top to bottom comprises said active layer and said first semiconductor layer, and the depth of said hollow structure of each said plurality of pillar structures is down from said active layer to an arbitrary depth of said active layer, from said active layer to an exposed surface of said first semiconductor layer, from said active layer to an arbitrary depth of said first semiconductor layer, or from said active layer through said first semiconductor layer to an exposed surface of said substrate.

3. The light emitting device according to claim 1, wherein each said plurality of pillar structures comprises said first semiconductor layer, and the depth of said hollow structure of each said plurality of pillar structures is down from said first semiconductor layer to an arbitrary depth of said first semiconductor layer, or from said first semiconductor layer to an exposed surface of said substrate.

4. The light emitting device according to claim 1, wherein an outer surface and an inner surface of said plurality of pillar structures with said hollow structure is a rough surface.

5. The light emitting device according to claim 1, wherein a portion surface of said first semiconductor layer, a sidewall of said active layer, and a sidewall of said second semiconductor layer is a rough surface.

6. The light emitting device according to claim 1, further comprising a first electrode disposed on said second portion surface of said first semiconductor layer.

7. The light emitting device according to claim 1, wherein said transparent conductive layer exposed a portion surface of said second semiconductor layer.

8. The light emitting device according to claim 7, further comprising a second electrode disposed on an exposed surface of said second semiconductor layer, and connected with said transparent conductive layer.

9. The light emitting device according to claim 1, further comprising a second electrode disposed on said transparent conductive layer.

* * * * *